United States Patent [19]

Fette et al.

[11] 3,916,223

[45] Oct. 28, 1975

[54] MOS SQUARING SYNCHRONIZER-AMPLIFIER CIRCUIT

[75] Inventors: Bruce A. Fette, Tempe; James J. Remedi, Glendale, both of Ariz.

[73] Assignee: Motorola, Inc., Chicago, Ill.

[22] Filed: Jan. 2, 1974

[21] Appl. No.: 430,328

[52] U.S. Cl. ................ 307/261; 307/208; 307/251; 307/269; 307/304

[51] Int. Cl.². H03K 5/00; H03K 19/08; H03K 1/17

[58] Field of Search ............ 307/221 C, 221 D, 208, 307/251, 261, 268, 269, 304; 328/63, 151

[56] References Cited

UNITED STATES PATENTS

| | | | |
|---|---|---|---|
| 3,379,980 | 4/1968 | King | 307/269 |
| 3,431,433 | 3/1969 | Ball et al. | 307/221 C |
| 3,509,472 | 4/1970 | Arlen | 307/269 |
| 3,510,783 | 5/1970 | Smith | 307/269 |
| 3,599,018 | 8/1971 | Washizuka | 307/251 |
| 3,633,091 | 1/1972 | Bowers | 307/261 |
| 3,739,193 | 6/1973 | Pryor | 307/304 |
| 3,745,371 | 7/1973 | Suzuki | 307/221 C |
| 3,766,408 | 10/1973 | Suzuki et al. | 307/279 |
| 3,819,953 | 6/1974 | Puckette et al. | 307/221 D |
| 3,819,954 | 6/1974 | Butler et al. | 307/221 D |

*Primary Examiner*—Stanley D. Miller, Jr.
*Attorney, Agent, or Firm*—Vincent J. Rauner; Charles R. Hoffman

[57] ABSTRACT

A MOS squaring synchronizer-amplifier circuit is provided for converting a relatively low amplitude asynchronous input signal to a relatively large square wave output signal synchronized with respect to a clock signal. The asynchronous input signal is coupled to the input of a first amplifier circuit which has its input voltage biased to the threshold voltage of a following latching amplifier circuit. The output of the first amplifier circuit is coupled by a series connected MOSFET to the input of the latching amplifier circuit, which has feedback through a MOSFET clocked by a reference signal. The output of the latching amplifier circuit is coupled to the output of the squaring synchronizer-amplifier circuit by a MOSFET clocked by the reference signal. The frequency of the reference signal may be many times that of the asynchronous input signal. A synchronous square wave output signal results if the input signal is periodic.

5 Claims, 3 Drawing Figures

MOS SQUARING SYNCHRONIZER-AMPLIFIER CIRCUIT

BACKGROUND OF THE INVENTION

In certain applications it is desirable to have MOS circuitry which is capable of converting an asynchronous, low amplitude AC signal to a relatively large amplitude square wave which is synchronized to a higher frequency clock signal or reference signal. For example, in certain MODEM (modulator-demodulator) systems a 1050 Hz signal may be used to represent a logical 0 and a 1250 Hz signal may be used to represent a logical 1. In such a system it is required to have a circuit which will convert a low amplitude (for example, 1 volt) AC signal of either of the two frequencies to square waves synchronized to a system clock of a much higher repetition rate, such that MOS integrated circuitry may be utilized to measure the width of one of the square wave pulses and thereby determine whether the input signal is of a frequency representing a logical 1 or a logical 0. In a monolithic MOS implementation of such a MODEM system, a circuit having the above-described characteristics would be very advantageous in that it could be implemented on the same semiconductor chip as the detecting circuitry. However, known circuitry for providing the above function has involved the use of bipolar transistor circuitry including such circuits as operational amplifiers and digital logic circuits. Such circuits have had the disadvantage of not being readily implementable in monolithic integrated circuit devices. Such circuits have had other disadvantages in that they were not activated at the zero crossing point of the AC input signal, but at some other point thereof. This has led to a generation of intermediate width pulses at the point of which the frequency changes from that representing a 1 to that representing a 0. This, in turn, reduces the noise immunity of such systems.

SUMMARY OF THE INVENTION

It is an object of the invention to provide an improved squaring synchronizer circuit.

It is another object of the invention to provide a squaring synchronizer-amplifier circuit.

It is another object of the invention to provide a squaring synchronizer-amplifier circuit for converting an asynchronous signal to a rectangular output signal synchronized with a reference signal including a latching amplifier circuit having feedback controlled by the reference signal and input bias circuitry which establishes the quiescent voltage of an input conductor at a voltage approximately equal to the threshold voltage of the latching amplifier circuit.

It is another object of the invention to provide a squaring syncaronizer-amplifier circuit implemented with MOSFET transistors.

It is another object of the invention to provide a squaring synchronizer-amplifier circuit including a first amplifier having feedback biasing means for establishing the quiescent voltage at the input approximately at the threshold voltage of the latching amplifier circuit and providing an isolation MOSFET clocked by a reference signal between said first amplifier and said latching amplifier circuit.

Briefly described, the invention includes a latching amplifier having input biasing circuitry for establishing quiescent voltage at the input approximately at the threshold voltage of the amplifier and feedback means controlled by a reference clock signal. A capacitor couples the input signal to the input of the latching amplifier. In one embodiment of the invention, an additional input amplifier is provided and inserted between the input coupling capacitor and the latching amplifier circuit. The input bias means in this case includes a feedback device which biases the input amplifier quiescent level to be equal to the threshold voltage of the latching amplifier section. An output coupling device controlled by a reference signal provides a high integrity square wave signal.

DESCRIPTION OF THE INVENTION

Figure 1:
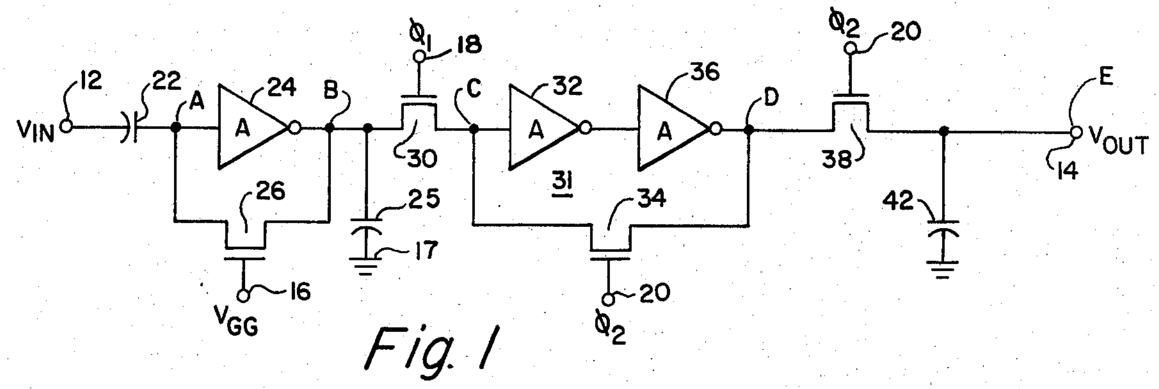
FIG. 1 is a schematic diagram of a preferred embodiment of the invention.

FIG. 1 depicts a schematic diagram of a preferred embodiment of the invention. Squaring synchronizer-amplifier circuit 10 includes an input conductor 12, an output conductor 14, and first and second clock signal conductors 18 and 20. Input conductor 12 is connected to one electrode of coupling capacitor 22, the opposite electrode of which is coupled to the input (node A) of amplifierr amplifier Input bias transistor 26 has one main electrode coupled to node A and another main electrode coupled to the output of amplifier 24, at node B. The gate electrode of MOSFET 26 is coupled to $V_{GG}$ conductor 16. Input conductor 12 is adapted to receive an input signal. Holding capacitor 25 is coupled between output node B and ground conductor 17. Coupling MOSFET 30 is connected between output node B of amplifier 24 and input node C of latching amplifier 31 which includes amplifiers 32 and 36 and feedback MOSFET 34. The gate electrode of coupling MOSFET 30 is connected to clock signal conductor 18 which is adapted for having a first clock signal $\phi_1$ applied thereto. Amplifiers 32 and 36 are cascaded so that the output of amplifier 32 is connected to the input of amplifier 36, the output of which is connected to node D. Node D is connected to one main electrode of feedback MOSFET 34, the other main electrode thereof being coupled back to node C. The gate of MOSFET 34 is connected to clock signal conductor 20 which is adapted to receive a second clock signal $\phi_2$. (It should be noted in the description herein and in the appended claims that MOSFET devices include first and second main electrodes, which may interchangeably function as a source or a drain, depending on the relative voltages thereon.) Coupling MOSFET 38 is connected between node D and output node E of output conductor 14. Holding capacitor 42 is connected between node E and ground conductor 17. The gate electrode of coupling MOSFET 38 is connected to clock signal conductor 20.

Figure 2:
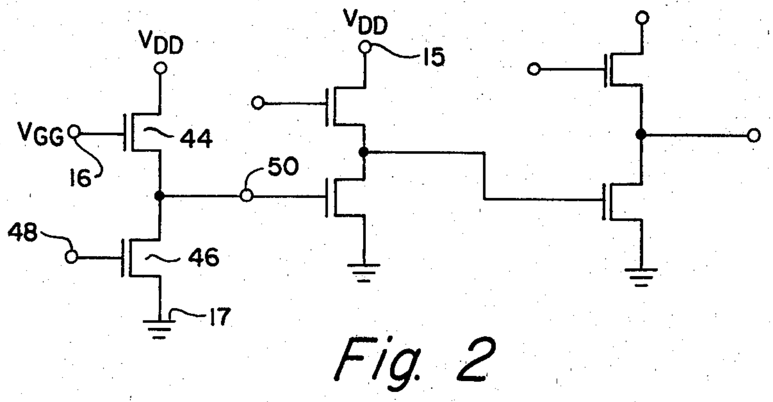
FIG. 2 is a schematic diagram of an implementation of the input amplifier of the embodiments of FIG. 1.

FIG. 2 is a schematic diagram of an implementation of amplifier 24 in FIg. 1. The amplifier shown in FIG. 2 is simply a cascaded connection of three MOSFET amplifiers. MOSFETS 44 and 46 are connected in series, the drain of MOSFET 44 being connected to $V_{DD}$ conductor 15; its gate being connected to $V_{GG}$ conductor 16, and its source being connected to the drain of MOSFET 46, the source of which is connected to ground conductor 17 and the gate of which is connected to input conductor 48, which may be the same as node A in FIG. 1. The two following stages of amplifier 24 may be of substantially similar configuration. Similarly, amplifiers 32 and 36 of FIG. 1 may be either single stage or three stage MOS amplifiers similar to the composite amplifier of FIG. 2 or a single stage thereof. The operation of the amplifying squaring synchronizing circuit of FIG. 1 may be described conveniently with reference to the timing diagram in FIG. 3.

Figure 3:
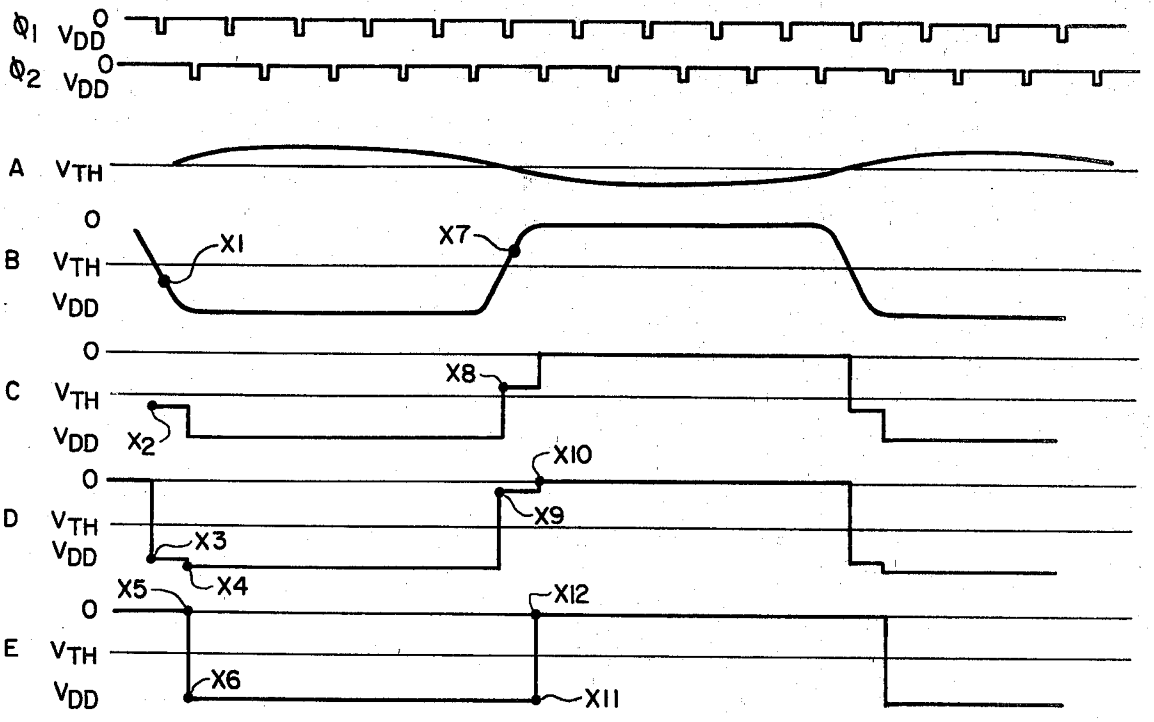
FIG. 3 is a timing diagram useful in describing the operation of the invention as shown in FIG. 1.

In FIG. 3, the first two waveforms are designated by the symbols $\phi_1$ and $\phi_2$. The polarities of the signals indicated in FIG. 3 are chosen in accordance with the assumption that the circuit of FIG. 1 is implemented using P-channel MOSFET devices, so that the voltages $V_{DD}$ and $V_{GG}$ are more negative than the ground potential on conductor 17. Of course, the polarity of the signals can be reversed if N-channel or complementary MOSFETs are utilized.

The relatively low frequency audio signal, which may be approximately 2 KHz appearing at node A of FIG. 1 is illustrated by waveform A, and is efficiently coupled from the input signal applied to conductor 12 if coupling capacitor 22 is sufficiently large. For example, capacitor 22 may be 0.1 microfarads. Amplifier 24 may have a gain in its linear region of approximately 1000, and amplifies the signal applied at node A to produce the signal shown in waveform B. The signal at node B swings between ground and $V_{DD}$ volts, which are the linearity limits of amplifier 24. As previously mentioned, the signal of waveform A is asynchronous with respect to clock signals $\phi_1$ and $\phi_2$. Assume that the voltage at node B is at point $X_1$ of waveform B during the first $\phi_1$ pulse. Note that the voltage at point $X_1$ is slightly more positive than the $V_{TH}$, the threshold voltage of amplifier 32. Then, during the first $\phi_1$ pulse, the voltage on node B is transferred through MOSFET 30 to node C, as indicated by point $X_2$ on waveform C. Also during the $\phi_1$ pulse, the voltage on node D is amplified by the gain of latching amplifier 31 which includes inverting amplifier stages 32 and 36 as previously described. Thus, during $\phi_1$, the voltage at node D undergoes a transition which takes it still closer to the limiting supply voltage $V_{DD}$, as indicated by point $X_3$ on waveform D. During the subsequent $\phi_2$ pulse, MOFSET 34 is turned on and positive feedback of the voltage at node D to node C occurs, resulting in the voltage at node D being clamped to the $V_{DD}$ power supply voltage if it has not already reached that value, as indicated at point $X_4$ of waveform D. MOSFET 38 is also turned on during the $\phi_2$ pulse, and couples the voltage at node D to node E, resulting in the transition from point $X_5$ to point $X_6$ of waveform E.

Subsequent $\phi_1$ pulses have no effect on the waveforms of node E until the occurrence of the first $\phi_1$ pulse which occurs after the zero crossing point of the waveform of node A. The voltage at node B at this time is indicated by point $X_7$. The voltage at $X_7$ is transferred through MOSFET 30 during $\phi_1$ as indicated by point $X_8$ of waveform C. The voltage at waveform C is amplified during the time between $\phi_1$ and the subsequent $\phi_2$ pulse resulting in the voltage at D being at point $X_9$, relatively close to ground potential. During the subsequent $\phi_2$ pulse, MOSFET 34 is turned on, causing latching amplifier 31 to latch up so that the voltage at node D is clamped to ground, as indicated by point $X_{10}$ of waveform D. Simultaneously, MOSFET 38 is turned on and waveform E undergoes a transition from point $X_{11}$ to $X_{12}$. During the subsequent clock pulses, waveform E remains unchanged until the next zero-crossing point of waveform A. Thus, it is seen that the low level audio signal represented by waveform A is synchronized with clock pulses $\phi_1$ and $\phi_2$ and an amplified squarewave signal is obtained at node E.

It should be noted that for some applications, the first amplifier stage including amplifier 24 and MOSFET 26 could be eliminated, and also MOSFET 30 could be eliminated and the input signal coupled through a coupling capacitor to node C. Some type of biasing circuit would be required to establish the quiescent voltage of node C at approximately the threshold voltage of latching amplifier 31 in this case. Then, the signal would be amplified by amplifiers 32 and 36, and synchronized by the action of $\phi_2$ and MOSFET 34. Of course, the input signal at waveform A does not need to be an audio sine wave. It may be a square wave or some other periodic or semi-periodic asynchronous signal. The circuit performance is nevertheless similar to that described above. It should also be noted that complementary MOS (CMOS) implementations are within the scope of the invention, wherein the coupling devices such as 30, 34 or 38 may be CMOS transmission gates which are well known in the art.

In summary, the MOS squaring synchronizer has an amplifier circuit according to the invention converts a low amplitude, relatively slow asynchronous input signal into a large amplitude square wave synchronous with a reference signal. The circuit is readily implementable on a MOS integrated circuit chip having thereon complex circuitry for processing the signal provided by the circuit of the subject invention.

While the invention has been described in relation to a preferred embodiment thereof, those skilled in the art will recognize that variations in connections and placement of parts may be made within the scope of the invention to suit various requirements.

What is claimed is:

1. A synchronizer-amplifier squaring circuit for amplifying a low amplitude asynchronous input signal to produce a relatively large square or rectangular wave output signal limited in magnitude by supply voltages coupled to said synchronizer-amplifier squaring circuit and synchronized to a clock signal, said low amplitude low asynchronous input signal being of lower amplitude than said square or rectangular wave output signal and not being synchronized to said clock signal or any other clock signal coupled to said synchronizer-amplifier squaring circuit, said synchronizer-amplifier squaring circuit comprising:

first inverting amplifier circuit means for amplifying said low amplitude asynchronous input signal, said first inverting amplifier circuit means having an input and an output;

input capacitor coupling means coupled between said input of said first inverting amplifier circuit means and an input of said synchronizer-amplifier squaring circuit for having said low amplitude asynchronous input signal applied thereto;

direct current unity gain biasing circuit means coupled between said input and said output for biasing said first inverting amplifier circuit means substantially at its unity gain point;

a latching amplifier circuit connected to said output;

synchronizing feedback circuit means coupled to a clock signal conductor and an input and an output of said latching amplifier circuit for synchronizing and establishing a firm voltage level, limited by said supply voltages, of an output signal of said latching amplifier circuit; and synchronizing coupling means coupled between an output of said latching amplifier circuit and an output of said synchronizer-amplifier squaring circuit for coupling said relatively large output signal from said output of said latching circuit to said output of said synchronizer-amplifier squaring circuit.

2. The synchronizer-amplifier squaring circuit as recited in claim 1, the said output of said first inverting amplifier circuit means being coupled to an input of said latching amplifier circuit by first coupling means for synchronizing an output signal of said first amplifier circuit means to a said clock signal.

3. A synchronizer-amplifier squaring circuit as recited in claim 2 wherein said unity gain biasing circuit means includes a MOSFET having a gate electrode coupled to voltage conductor means, a first main electrode coupled to the output of said first inverting amplifier circuit means and a second main electrode coupled to the input of said first inverting amplifier circuit means.

4. The synchronizer-amplifier squaring circuit as recited in claim 3 further including second feedback coupling means including a second MOSFET having a gate electrode coupled to said clock signal conductor, a first main electrode coupled to said input of said latching amplifier circuit and a second main electrode coupled to said output of said latching amplifier circuit.

5. The synchronizer-amplifier squaring circuit as recited in claim 4 further including a third MOSFET having a first main electrode coupled to said output of said latching amplifier circuit, a second main electrode coupled to said output of said synchronizer-amplifier squaring circuit and a gate electrode coupled to said clock signal conductor, a first capacitor coupled between said output of said first inverting amplifier circuit means and voltage conductor means, and a second capacitor coupled between said output of said latching amplifier circuit and said voltage conductor means.

* * * * *